United States Patent
Hudson et al.

(10) Patent No.: US 8,358,121 B2
(45) Date of Patent: Jan. 22, 2013

(54) DIGITAL MULTIMETER HAVING REMOTE DISPLAY WITH AUTOMATIC COMMUNICATION MODE SWITCHING

(75) Inventors: Jeffrey C. Hudson, Snohomish, WA (US); Nathaniel J. Wetzel, Seattle, WA (US)

(73) Assignee: Fluke Corporation, Everett, WA (US)

( * ) Notice: Subject to any disclaimer, the term of this patent is extended or adjusted under 35 U.S.C. 154(b) by 694 days.

(21) Appl. No.: 12/356,885

(22) Filed: Jan. 21, 2009

(65) Prior Publication Data

US 2010/0181990 A1 Jul. 22, 2010

(51) Int. Cl.
*G01R 1/38* (2006.01)

(52) U.S. Cl. .............. 324/115; 324/121 R; 398/115

(58) Field of Classification Search .............. 324/115, 324/121 R; 398/115
See application file for complete search history.

(56) References Cited

U.S. PATENT DOCUMENTS

| | | | |
|---|---|---|---|
| 4,608,532 A | 8/1986 | Ibar et al. | |
| 4,942,356 A * | 7/1990 | Ellingen et al. | 324/156 |
| 5,640,155 A | 6/1997 | Springer | |
| 5,880,867 A | 3/1999 | Ronald | |
| 6,035,350 A | 3/2000 | Swamy et al. | |
| 6,043,640 A | 3/2000 | Lauby et al. | |
| 6,436,038 B1 | 8/2002 | Engstrom | |
| 6,445,175 B1 | 9/2002 | Estep et al. | |
| 6,466,003 B1 | 10/2002 | Gallavan et al. | |
| 6,568,848 B1 | 5/2003 | Chapman et al. | |
| 6,784,855 B2 | 8/2004 | Matthews et al. | |
| 6,812,685 B2 * | 11/2004 | Steber et al. | 324/72.5 |
| 6,912,379 B2 * | 6/2005 | Horng | 455/226.4 |
| 6,944,402 B1 * | 9/2005 | Baker et al. | 398/128 |
| 7,034,517 B2 | 4/2006 | Newcombe | |
| 7,075,289 B2 | 7/2006 | Chen | |
| 7,109,700 B2 | 9/2006 | Fazzina | |
| 7,183,999 B2 | 2/2007 | Matthews et al. | |
| 7,304,618 B2 * | 12/2007 | Plathe | 345/2.3 |
| 7,382,272 B2 | 6/2008 | Feight | |
| 7,411,577 B2 | 8/2008 | Kim et al. | |
| 2003/0137310 A1 | 7/2003 | Holzel | |

(Continued)

FOREIGN PATENT DOCUMENTS

DE 202004011873 U1 12/2004
FR 2873839 A1 2/2006

(Continued)

OTHER PUBLICATIONS

Broesch, J.D.; Petersen, P.I.; Hansink, M.J., Abstract of article entitled, "A handheld, free roaming, data display for DIII-D diagnostic data," IEEE Transactions on Nuclear Science, published Apr. 2000.

(Continued)

*Primary Examiner* — Arleen M Vazquez
(74) *Attorney, Agent, or Firm* — Nelson, Mullins, Riley & Scarborough LLP

(57) ABSTRACT

A multimeter comprising a base unit having at least one test lead terminal. A remote display unit separate from the base unit is also provided. The remote display unit has a display operative to show measured parameters. The multimeter further comprises communication circuitry operative to provide electrical communication between the base unit and the remote display unit. The communication circuitry provides electrical communication in a plurality of alternative communication modes. At least two of the alternative communication modes are preferably wireless communication modes.

28 Claims, 9 Drawing Sheets

U.S. PATENT DOCUMENTS

| | | | |
|---|---|---|---|
| 2003/0184515 A1* | 10/2003 | Tsai | 345/156 |
| 2004/0160410 A1 | 8/2004 | Plathe | |
| 2004/0239308 A1 | 12/2004 | Fazzina | |
| 2005/0231134 A1 | 10/2005 | Sid | |
| 2005/0246295 A1 | 11/2005 | Cameron | |
| 2006/0022663 A1 | 2/2006 | Chen | |
| 2006/0119540 A1 | 6/2006 | Dobson et al. | |
| 2008/0143317 A1 | 6/2008 | Dave | |
| 2008/0231256 A1 | 9/2008 | Cox et al. | |
| 2009/0202250 A1 | 8/2009 | Dizechi et al. | |
| 2011/0069961 A1 | 3/2011 | Hudson et al. | |

FOREIGN PATENT DOCUMENTS

| | | |
|---|---|---|
| TW | M257451 A1 | 2/2005 |
| WO | 2005124370 A1 | 12/2005 |

OTHER PUBLICATIONS

Chinese Office Action issued by Chinese Patent Office on Aug. 24, 2011 regarding corresponding Chinese application No. 200910134310.1.

Office Action issued by the Chinese Patent Office on Mar. 12, 2012 for corresponding Chinese Application No. 200910134310.1. (12 pgs.).

U.S. Office Action issued by the U.S. Patent and Trademark Office on May 3, 2012 for co-pending U.S. Appl. No. 12/563,004, filed Sep. 18, 2009 (11 pgs.).

Office Action issued by the Chinese Patent Office on Sep. 6, 2012 for corresponding Chinese Application No. 200910134310.1 (11 pgs.).

Extended European Search Report issued by the European Patent Office on Nov. 11, 2012 for corresponding European Application No. 09156905.3.

* cited by examiner

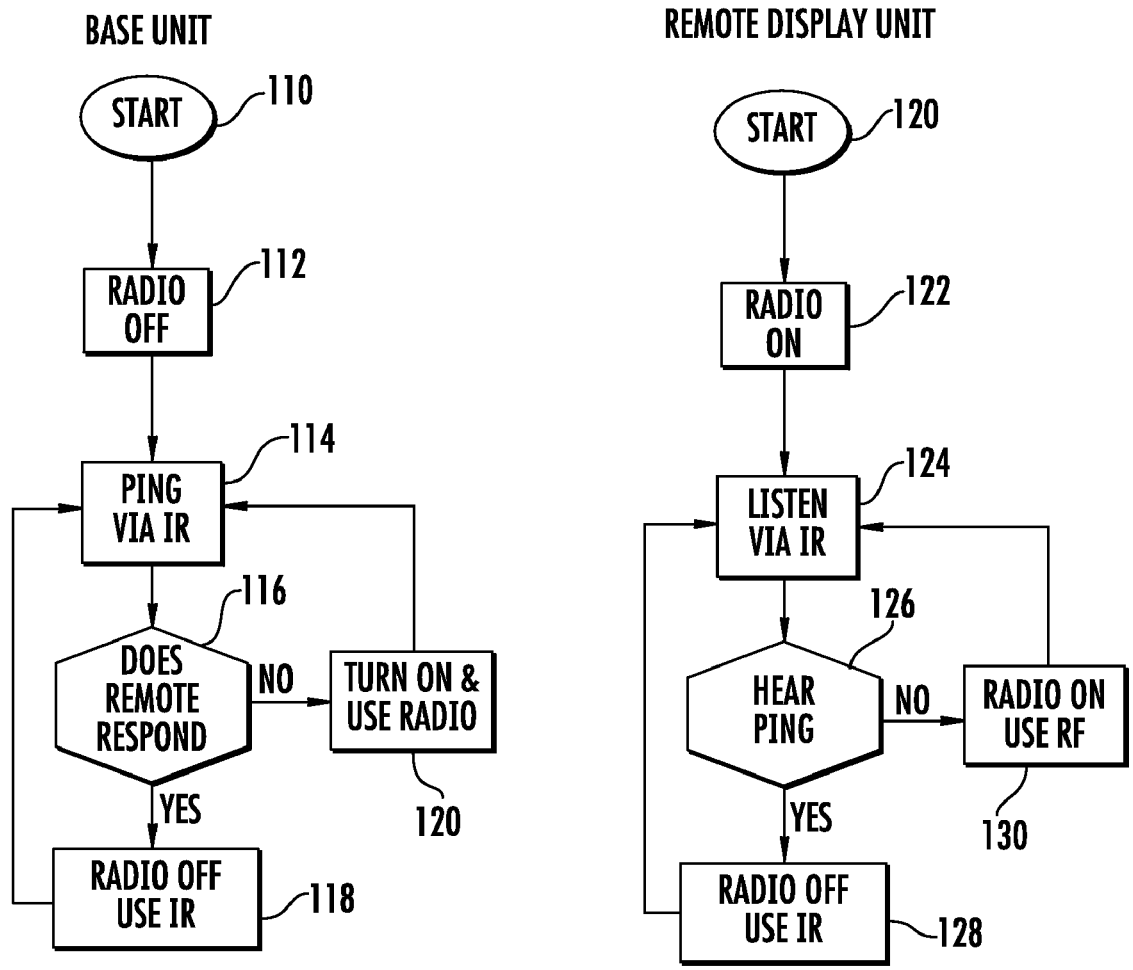

DIGITAL MULTIMETER HAVING REMOTE DISPLAY WITH AUTOMATIC COMMUNICATION MODE SWITCHING

BACKGROUND OF THE INVENTION

The present invention relates generally to digital multimeters. More particularly, the invention relates to a digital multimeter having a remote display with automatic communication mode switching.

Digital multimeters (DMMs) function to measure a number of electrical parameters as needed for service, troubleshooting and maintenance. Such parameters may include AC voltage and current, DC voltage and current, resistance and continuity. In some cases, a DMM may measure other parameters such as capacitance and temperature.

A DMM will often be configured as a hand-held unit having a rotary knob by which various functions are selected. A plurality of lead jacks are provided in the case (i.e., housing) of the unit for connection of test leads. The specific jack used may depend on the function that has been selected. An LCD display provides a reading of the tested parameter. Details regarding the construction and operation of multimeters may be discerned from U.S. Pat. Nos. 7,034,517, 6,466,003 and 6,043,640, each of which is incorporated herein by reference in its entirety.

Generally, it is desired to place the DMM on a flat surface such as a shelf as measurements are being conducted. Often, however, the shelf may be in a position making it difficult to view the LCD display. In this circumstance, the user may be required to look away from the point of measurement in order to see the measurement reading. A remote display, separate from the DMM but linked by communication to the DMM, may be used to lessen this difficulty. Examples of remote displays are shown in U.S. Pub. No. 2003/0137310 to Holzel and U.S. Pat. No. 7,304,618 to Plathe.

The remote display may use wireless coupling, such as infrared (IR) or radio frequency (RF), for communication with the DMM. While IR and RF are both effective, each has its limitations. RF utilizes a relatively high level of power, thus reducing battery life at the remote display. IR uses less power, but requires a line of sight between transmitter and receiver.

SUMMARY OF THE INVENTION

According to one aspect, the present invention provides a multimeter comprising a base unit having at least one test lead terminal. A remote display unit separate from the base unit is also provided. The remote display unit has a display operative to show measured parameters. The multimeter further comprises communication circuitry operative to provide electrical communication between the base unit and the remote display unit. The communication circuitry provides electrical communication in a plurality of alternative communication modes.

In exemplary embodiments, at least two of the alternative communication modes are wireless communication modes. For example, a first communication may be an optical communication mode (such as IR), whereas a second communication mode may be an RF communication mode.

It is often desirable if the communication circuitry provides electrical communication in a first communication mode when the remote display unit is located adjacent to the base unit and in a second communication mode when the remote display unit is located apart from the base unit. For example, the communication circuitry may first attempt to establish communication from the base unit in an IR communication mode and then switch to an RF communication mode if IR communication is unsuccessful.

Embodiments are contemplated in which the remote display unit has an end surface canted at an acute angle relative to perpendicular such that the display will be tilted when the remote display unit is placed on a horizontal surface. Preferably, the remote display unit may also be adapted to be placed on a vertical surface. For example, an internal magnet may be utilized to retain the remote display unit on the vertical surface.

In accordance with another aspect, the present invention provides a method of establishing electrical communication between a base unit and a separate remote display unit of an electrical test instrument. With one of the base unit and the remote display unit, a request for response via an IR communication mode is sent to the other of the base unit and the remote display unit. If a response to the request for response is received, then communication is maintained in an optical communication mode. If a response to the request for response is not received, then communication is established in an RF communication mode.

A further aspect of the present invention provides an electrical test instrument comprising a base unit and a remote display unit separate from but matable with the base unit. The remote display unit has a display operative to show measured parameters. The electrical test instrument further comprises communication circuitry operative to provide electrical communication between the base unit and the remote display unit. The communication circuitry is operative to provide electrical communication in a first communication mode when the remote display unit is mated with the base unit and a second communication mode when the remote display unit is located apart from the base unit.

Another aspect of the invention provides a multimeter comprising a base unit having a plurality of test lead jacks and a rotary selector knob. A remote display unit separate from but matable with the base unit is also provided. The remote display unit has a display operative to show measured parameters. The multimeter further includes communication circuitry operative to provide electrical communication between the base unit and the remote display unit. The communication circuitry is operative to provide electrical communication in a first communication mode when the remote display unit is mated with the base unit and a second communication mode when the remote display unit is located apart from the base unit. In this aspect, the first and second communication modes are wireless communication modes.

Other objects, features and aspects of the present invention are provided by various combinations and subcombinations of the disclosed elements, as well as methods of practicing same, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which:

FIGS. 10 and 11 are flowcharts respectively showing the manner in which the base unit and the remote display unit select a communication mode;

Figure 1:
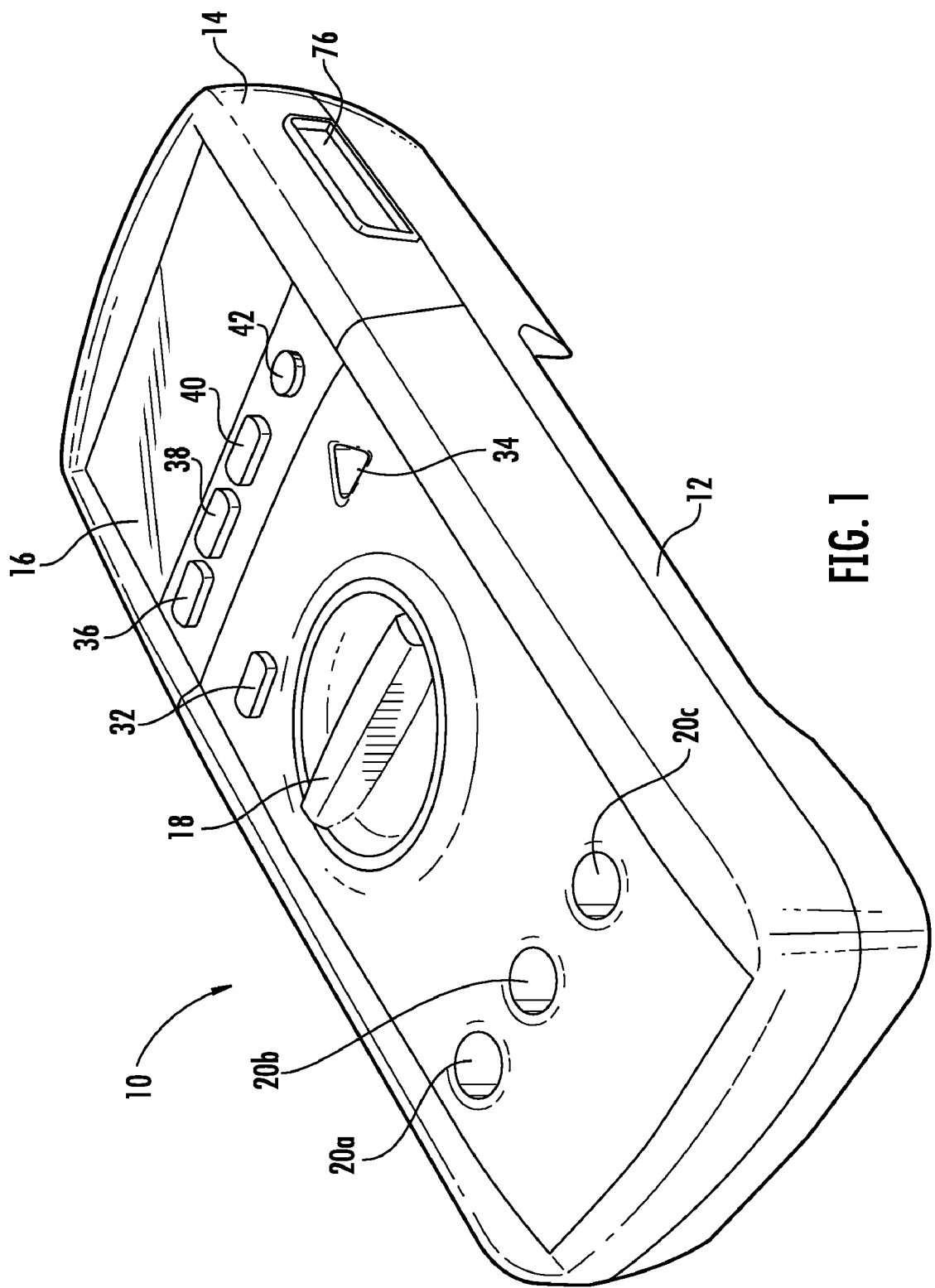
FIG. 1 is a top perspective view of a DMM constructed in accordance with an embodiment of the present invention.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary constructions.

FIGS. 1 through 4 illustrate a digital multimeter (DMM) 10 constructed in accordance with an embodiment of the present invention. Multimeter 10 comprises a base unit 12 and a remote display unit 14. The housing of base unit 12 defines an interior cavity in which various internal components are located. In this embodiment, the housing of base unit 12 is preferably formed having two or more housing members which are assembled together to form the interior cavity. Preferably, these housing members may be molded of high impact rigid plastic material. In some cases, it may be desirable to overmold a softer polymeric material on at least portions of the rigid plastic material to enhance gripability and user comfort.

In this case, remote display unit 14 is mated to base unit 12 such that its display 16 will be located in a conventional position on the overall DMM. Display 16, which will typically be an LCD display located behind a transparent window, shows a variety of information of interest to the user. Preferably, display 16 will include a backlight that may be activated when desired to facilitate use in low-light conditions.

Figure 5:
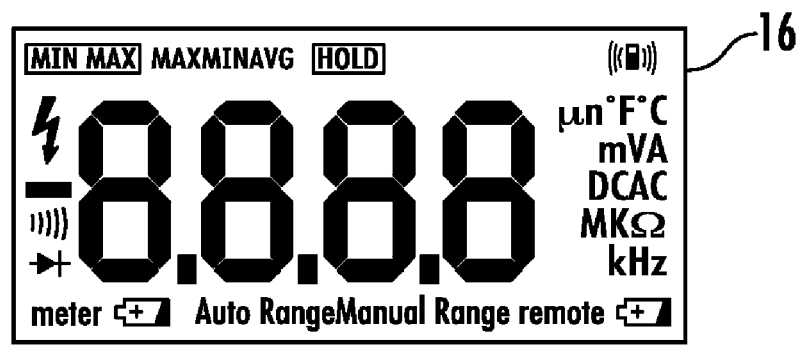
FIG. 5 illustrates the characters that may appear on the DMM's display in accordance with the embodiment of FIG. 1.

FIG. 5 depicts various characters (both numeric and symbolic) that may appear on display 16 depending on the operating mode of the DMM and other factors. As can be seen, the primary icons are a 4-digit, 7-segment numeric display. Along the right edge are the measurement annunciators which indicate the units of measurement displayed by the numbers. The bottom right and left icons indicate a low battery condition with the remote unit and base unit, respectively. Auto Range and Manual Range indicate the meter ranging condition. The icons on the top left indicate the display modes and the icon on the top right indicates RF communication mode. The lighting bolt indicates a predetermined high voltage on the test leads.

Base unit 12 includes a rotary selector knob 18 which allows the user to select a particular multimeter function. For example, 5-10 such functions may be indicated by respective stop positions in the knob rotation. As one skilled in the art will appreciate, suitable graphics will typically be printed on the top surface of the base unit housing to indicate the respective functions.

Figure 6:
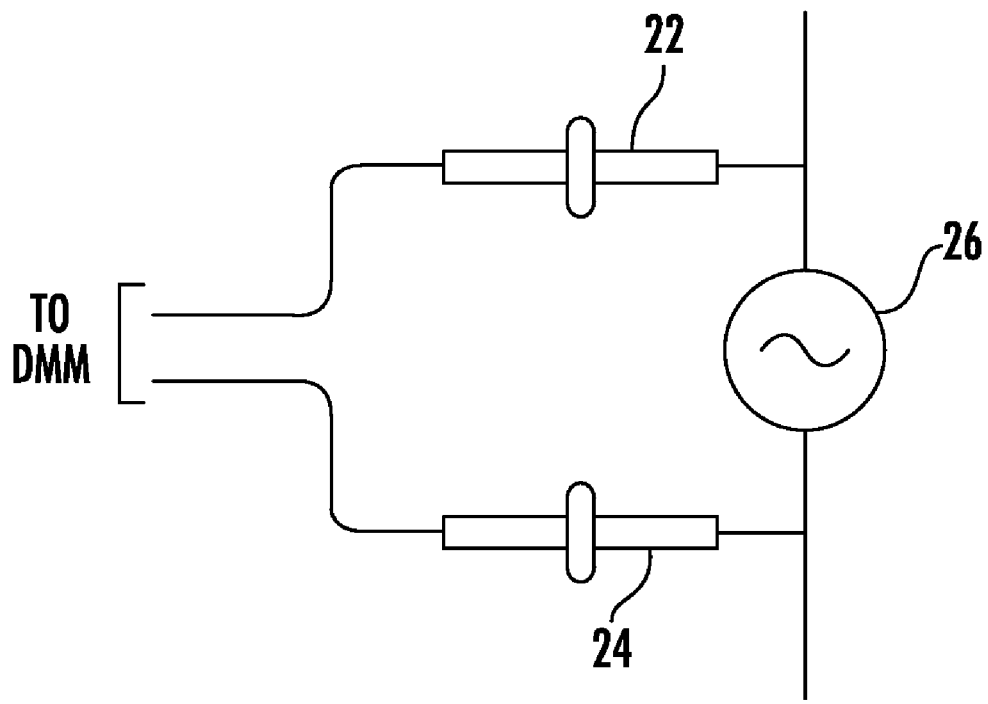
FIG. 6 is a diagrammatic representation showing test leads of a DMM connected to a circuit under test.

Base unit 12 also includes a plurality of jacks 20a-c for connection of respective test leads. In particular, two test leads are connected to a respective two of lead jacks 20a-c depending on the parameter being tested. In this regard, FIG. 6 shows a pair of test leads 22 and 24 connected to a circuit 26 under test.

Figure 4:
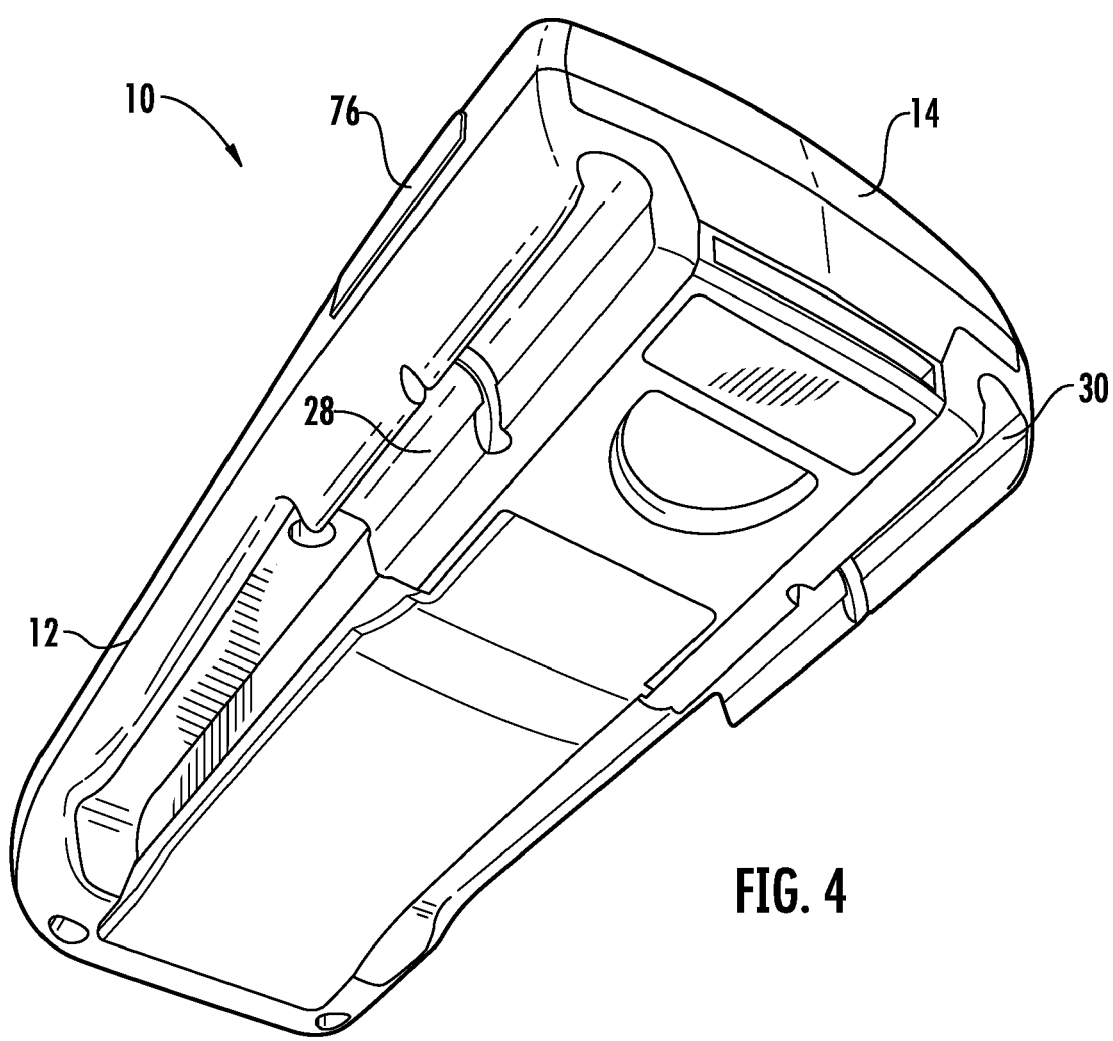
FIG. 4 is a bottom perspective view of the DMM of FIG. 1.

As shown in FIG. 4, DMM 10 preferably has test lead holders 28 and 30 defined on the bottom of base unit 12. Test lead holders 28 and 30 may be configured to retain the test leads in two orientations: (1) a storage orientation in which the leads are nested; and (2) a "third hand" orientation in which the terminal end of a test lead extends away from the DMM housing. In the "third hand" orientation, base unit 12 can be used to maintain the lead's terminal end in position on one side of circuit 26 under test while the user positions the other test lead. This leaves the user's second hand free to operate the DMM.

Referring again to FIGS. 1 and 2, certain additional features of DMM 10 will now be explained. In this regard, DMM 10 may include a shift key 32 located on base unit 12. Shift key 32 allows the user to select alternate functions for respective positions of selector knob 18. A high voltage indicator light 34 alerts a user who may not be viewing the remote display unit 14 (when separated from base unit 12) that the test lead has encountered a high voltage situation.

In this embodiment, a number of function buttons are also provided on remote display unit 14 itself. Typically, these buttons will relate to functions dealing directly with the display rather than the operating parameters of DMM 10. One skilled in the art will appreciate, however, that variations of the present invention are possible in which different user interface elements are placed on base unit 12 and/or remote display unit 14. For example, in some embodiments, it may be desirable not to have any selector buttons on remote display 14.

In the illustrated embodiment, a total of four function buttons are provided on remote display unit 14: hold button 36, min/max button 38, range button 40 and backlight button 42. As its name implies, backlight button 42 activates the internal light used to illuminate the LCD display.

By pressing hold button 36, the display will freeze the last displayed reading. Pressing hold button 36 again returns the display to normal updating mode.

Pressing min/max button 38 causes the display to enter the min/max mode. In this mode, the meter captures the smallest reading and the largest reading. These readings can be displayed by toggling min/max button 38. Holding the button for a couple of seconds returns the meter to normal display mode.

Pressing range button 40 puts the meter in manual range mode. Subsequent presses manually change the measurement range of the meter. Holding range button 40 for a couple of seconds returns the meter to autorange mode.

Figure 7:
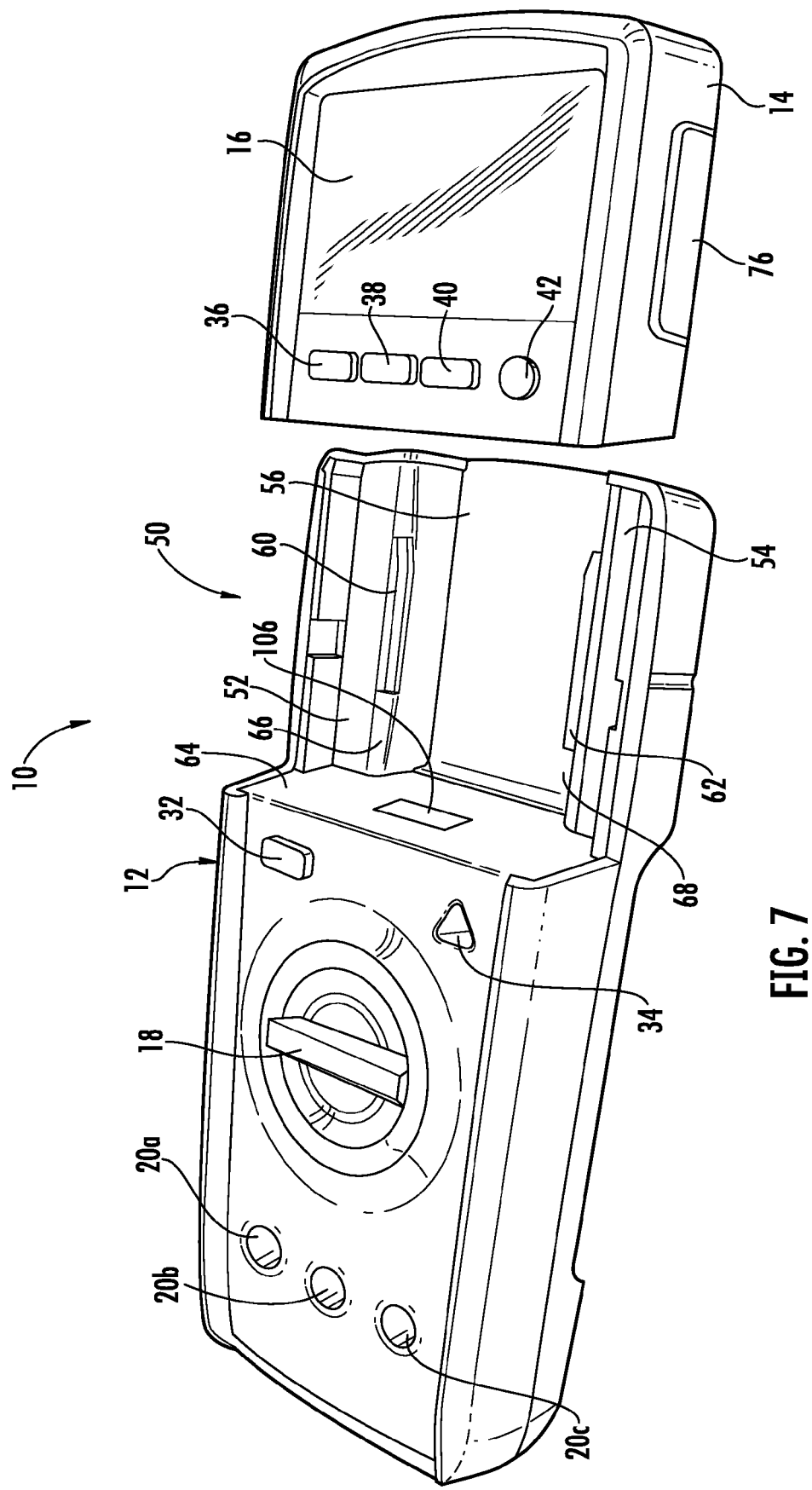
FIG. 7 is a perspective view of the DMM of FIG. 1 showing separation of the remote display unit.

FIG. 7 shows the manner in which remote display unit 14 is removed from base unit 12 in the illustrated embodiment. In this case, base unit 12 defines a receiving portion 50 at which remote display unit 14 is mated. Receiving portion 50 defines a pair of lateral rails 52 and 54 located on either side of a recess 56. The back of remote display unit 14 is generally complementary to the configuration of receiving portion 50. In this regard, remote display unit 14 includes a back portion 58 adapted to be slidably received in recess portion 56.

A suitable latching mechanism is preferably provided to retain remote display unit 14 with respect to base unit 12. When it is desired to separate remote unit from base unit 12, the latching mechanism is easily releasable by the user. In this embodiment, for example, rails 52 and 54 include respective flanges 60 and 62 extending part of the way along their length. In particular, flanges 60 and 62 terminate before reaching wall 64 of base unit 12 to define respective gaps 66 and 68.

Figure 8:
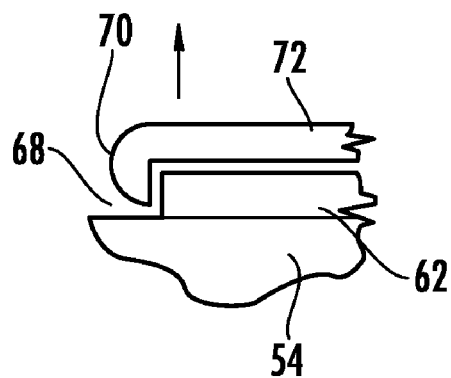
FIG. 8 illustrates the manner in which the retaining mechanism may be released for separation of the remote display unit.

Referring now to FIG. 8, gap 68 receives the end projection 70 of a spring-loaded latching arm 72 carried by the remote display unit 14. End projection 70 thus retains remote display unit 14 in position by engaging the end surface of flange 62. As one skilled in the art will appreciate, a similar latching arm is associated with the other flange 60.

Figure 2:
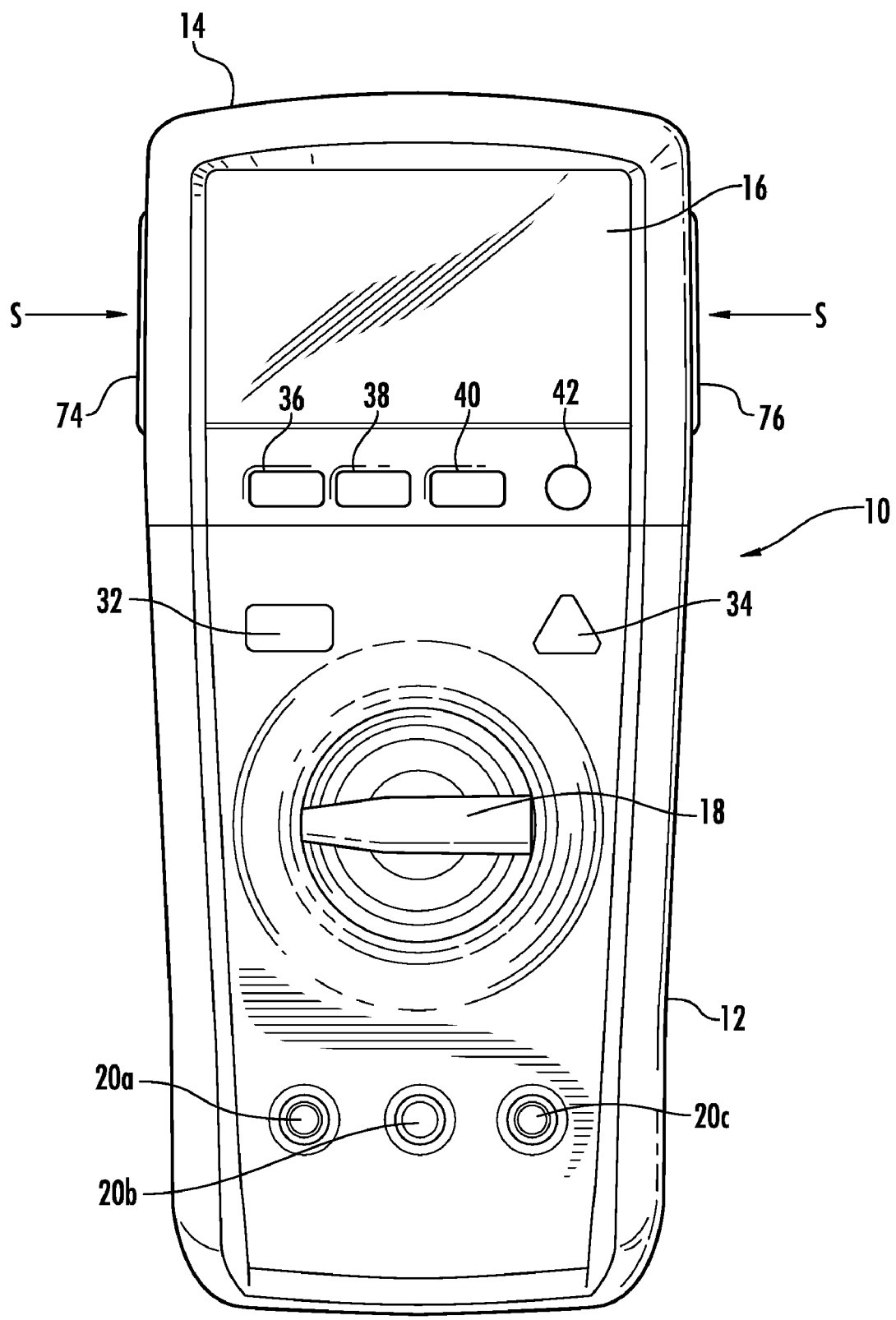
FIG. 2 is a top plan view of the DMM of FIG. 1.
Figure 3:
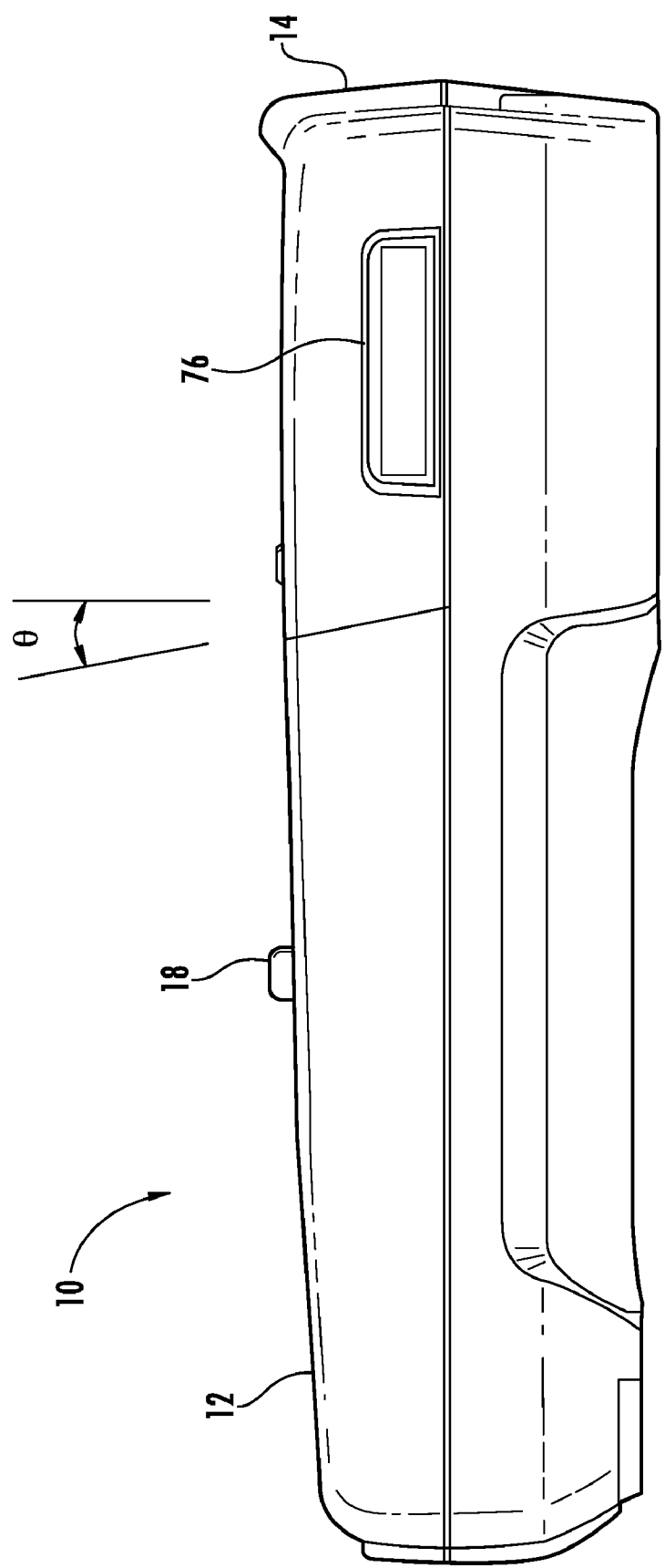
FIG. 3 is a side elevational view of the DMM of FIG. 1.

When it is desired to separate remote display unit 14 from base unit 12, the user depresses release buttons 74 and 76 located on the respective sides of remote display unit 12 (as indicated by arrows S in FIG. 2). Release buttons 74 and 76 are operatively connected to an associated latching arm, thus causing the latching to move inward (and away from its corresponding flange 60 or 62 on base unit 12). The user can then simply slide remote display unit 14 until it is completely separated from base unit 12.

As will now be explained, DMM 10 is preferably operable to switch between first and second communication modes depending on whether remote display unit 14 is mated or separated with respect to base unit 12. In this regard, remote display unit 14 will preferably communicate with base unit 12 using RF communication when the two units are separated from each other. As noted above, RF communication is advantageous because it does not require a direct line of sight between base unit 12 and remote display unit 14.

Often, however, RF communication will consume more power than some other types of wired or wireless communication. Therefore, DMM 10 is adapted to switch to a lower power mode of communication when remote display unit 14 is attached to base unit 12. In this embodiment, for example, DMM 10 utilizes IR communication when remote display unit 14 is mated.

Thus, the present embodiment utilizes two different types of wireless communication depending on whether or not remote display unit 14 is separated from base unit 12. As one skilled in the art will appreciate, however, direct electrical connection can alternatively be used when remote display unit 14 is docked. Generally, however, it will be preferable to utilize wireless communication even when the two units are mated to eliminate the need for exposed metal conductors.

In some embodiments, a mechanical switch can be used to achieve communication mode switching. Often, however, it will be preferable to use logical methodology to determine whether remote display unit 14 is mated with or separated from base unit 12.

Figure 9:
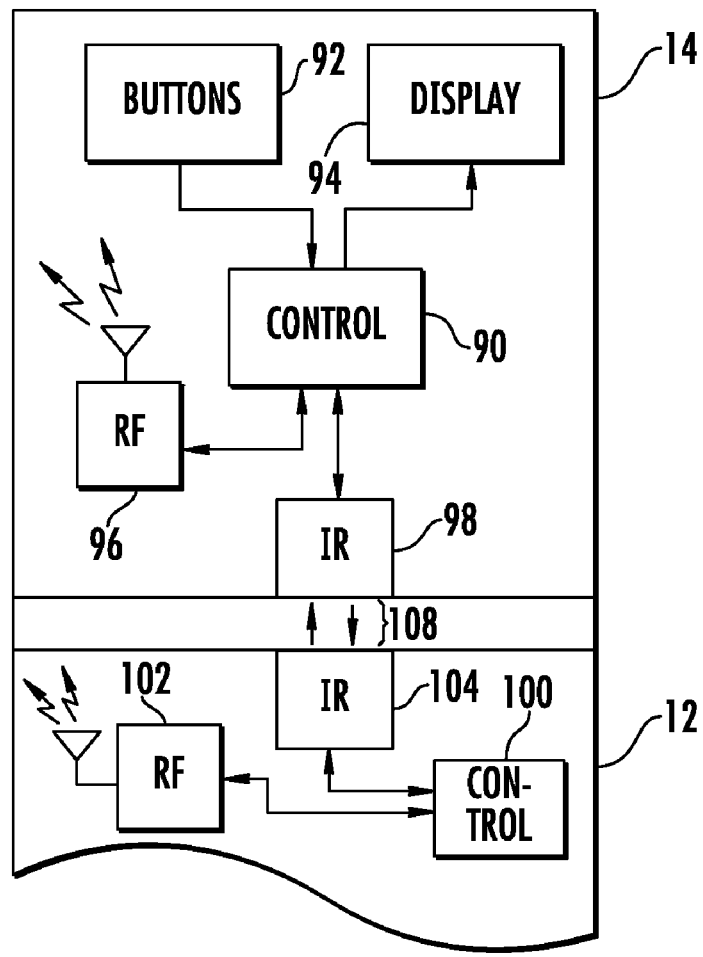
FIG. 9 is a diagrammatic representation showing communication between the remote display unit and base unit when the remote display unit is mated with the base unit.

Referring now to FIG. 9, remote display unit 14 includes control circuitry 90, which receives inputs from buttons 92 and provides information to display 94. Control circuitry 90 also selects whether to communicate with base unit 12 via RF transceiver 96 or IR interface 98. RF transceiver 96 may include any circuit components necessary in order to effect RF communication with base unit 12. These may include a digital-to-analog converter, frequency generator, modulator and antenna. Similarly, IR interface 98 will include components necessary for IR communication, such as an IR-LED and photodetector. As one skilled in the art will appreciate, control circuitry 90 may be implemented in hardware, firmware, software, or a combination thereof as necessary or desirable.

Base unit 12 will likewise include circuit elements used in communicating with remote display unit 14. For example, control circuitry 100 (which may be implemented as hardware, firmware, software, or a combination thereof) is in electrical communication with an RF transceiver 102 and IR interface 104. Control circuitry 100 determines whether communication with remote display unit 14 should occur by RF transceiver 102 or IR interface 104.

As one skilled in the art will appreciate, both base unit 12 and remote display unit 14 are preferably equipped with an IR transmissive window, such as window 106 of base unit 12 (FIG. 7), which are aligned when remote display unit 14 is mated in order to provide the desired line of sight between IR interface 98 and IR interface 104 (as shown at 108 in FIG. 9).

FIGS. 10 and 11 illustrate respective processes that may be performed by control circuitry 100 and control circuitry 90 in order to switch communication between RF and IR modes as described above. Referring first to FIG. 10, the process implemented by control circuitry 100 begins as indicated at 110. Initially, the "radio" will be off (as indicated at 112), meaning that there will be no RF communication as this point. As indicated at 114, base unit 12 next "pings" remote display unit 14 via the IR interface. Then, as indicated at 116, control circuitry 100 waits for a predetermined period of time for a response from remote display unit 14. If the remote display unit 14 responds, IR communication rather than RF communication will be utilized as indicated at 118. On the other hand, if remote display unit 14 does not respond to the "ping," it is assumed that remote display unit 14 is separated from base unit 12. In this case, as indicated at 120, RF communication will be utilized rather than IR communication.

Referring now specifically to FIG. 11, a similar process occurs at control circuitry 90 of remote display unit 14. The process starts as indicated at 120. Initially, the process assumes a "radio on" condition, meaning that communication will occur via RF (as indicated at 122). Nevertheless, the process will continually listen for a "ping" via IR, as indicated at 124. Decision block 126 asks whether or not a ping is "heard." If a ping is heard, as indicated as 128, RF communication is switched off and IR communication will be utilized. On the other hand, if no ping is heard, the radio will remain on and RF communication will be utilized as indicated at 130.

Figure 12:
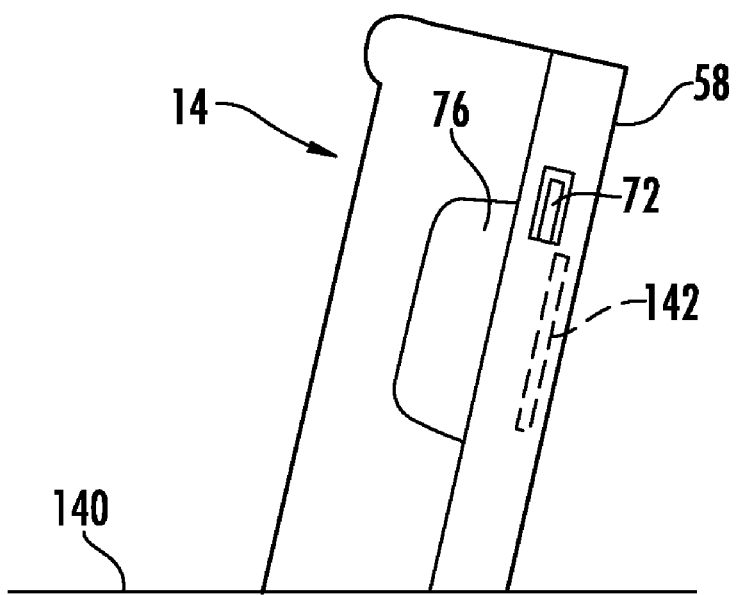
FIG. 12 shows the remote display unit placed on a flat surface, such as a shelf or table top.

Certain additional features of remote display unit 14 will now be explained. Before discussing FIG. 12, however, reference is made to FIG. 3. As can be seen, the physical interface between the end surface of remote display unit 14 and wall 64 of base unit 12 is situated at a small angle θ relative to the vertical. As shown in FIG. 12, this is advantageous because it will produce a slight tilt when remote display unit 14 is placed on a horizontal surface 140, such as a shelf or table. This tilt facilitates viewing by a user whose eye level will typically be higher than that of surface 140.

Figure 13:
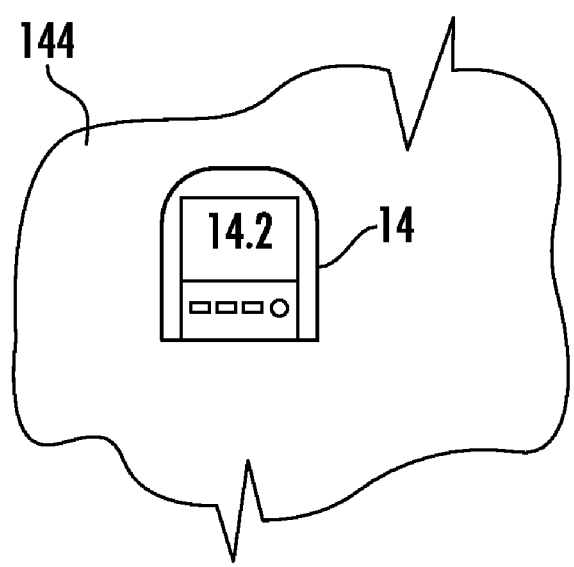
FIG. 13 shows the remote display unit attached to a vertical surface.

In some preferred embodiments, remote display unit 14 may be adapted for attachment to a vertical surface. In this case, for example, remote display unit 14 includes a magnet 142 located at back portion 58. Magnet 142 may be located inside of a removable door used to cover the battery compartment of remote display unit 14. As shown in FIG. 13, magnet 142 allows remote display unit 14 to be placed on any vertical surface 144 having suitable ferrous characteristics.

It can thus be seen that the present invention provides a digital multimeter having a remote display with automatic communication mode switching. While preferred embodiments of the invention have been shown and described, modifications and variations may be made thereto by those of ordinary skill in the art without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to be limitative of the invention as further described in the appended claims.

What is claimed is:

1. A multimeter comprising:
a base unit having at least one test lead terminal;
a remote display unit separate from said base unit, said remote display unit having a display operative to show measured parameters;
communication circuitry operative to provide electrical communication between said base unit and said remote display unit, said communication circuitry capable of said electrical communication in a plurality of alternative communication modes; and
wherein said communication circuitry attempts to establish communication from said base unit in an optical communication mode and then switches to a radio frequency (RF) communication mode if optical communication is unsuccessful.

2. A multimeter as set forth in claim 1,
wherein said optical communication mode is an infrared (IR) communication mode.

3. A multimeter as set forth in claim 1, wherein said communication circuitry provides electrical communication in a first communication mode when said remote display unit is located adjacent to said base unit and in a second communication mode when said remote display unit is located apart from said base unit.

4. A multimeter as set forth in claim 3, wherein said first communication mode is said optical communication mode.

5. A multimeter as set forth in claim 3, wherein said second communication mode is said RF communication mode.

6. A multimeter as set forth in claim 1, wherein said remote display unit is matable with said base unit.

7. A multimeter as set forth in claim 6, wherein said base unit has a receiving portion at which said remote display is slidably mated.

8. A multimeter as set forth in claim 6, further comprising a latching mechanism which releasably retains said remote display unit in mated relationship with said base unit.

9. A multimeter as set forth in claim 6, wherein said base unit includes:
a rotary selector knob; and
wherein said at least one test lead terminal comprises a plurality of test lead jacks.

10. A multimeter as set forth in claim 1, wherein said remote display unit has an end surface canted at an acute angle relative to perpendicular such that said display will be tilted when said remote display unit is placed on a horizontal surface.

11. A multimeter as set forth in claim 1, wherein said remote display unit is adapted to be placed on a vertical surface.

12. A multimeter as set forth in claim 11, wherein said remote display unit includes an internal magnet to retain said remote display unit on said vertical surface.

13. A multimeter as set forth in claim 1, wherein said remote display unit has a plurality of display function buttons located thereon.

14. A method of establishing electrical communication between a base unit and a separate remote display unit of an electrical test instrument, said method comprising steps of:

(a) with one of said base unit and said remote display unit, sending a request for response via an optical communication mode to the other of said base unit and said remote display unit;
(b) if a response to said request for response is received at said one of said base unit and said remote display unit, then maintaining communication with the other of said base unit and said remote display unit in said optical communication mode; and
(c) if a response to said request for response is not received at said one of said base unit and said remote display unit, then establishing communication with the other of said base unit and said remote display unit in a radio frequency communication mode.

15. A method as set forth in claim 14, wherein said base unit sends said request for response to said remote display unit.

16. A method as set forth in claim 14, wherein said optical communication mode is an RF communication mode.

17. An electrical test instrument comprising:
a base unit;
a remote display unit separate from but matable with said base unit, said remote display unit having a display operative to show measured parameters;
communication circuitry operative to provide electrical communication between said base unit and said remote display unit;
said communication circuitry operative to provide electrical communication in a first communication mode when said remote display unit is mated with said base unit and a second communication mode when said remote display unit is located apart from said base unit; and
wherein at least one of said first and second communication modes is a wireless communication mode.

18. An electrical test instrument as set forth in claim 17, wherein said first and second communication modes are wireless communication modes.

19. An electrical test instrument as set forth in claim 18, wherein said first communication mode is an optical communication mode.

20. An electrical test instrument as set forth in claim 9, wherein said optical communication mode is an infrared (IR) communication mode.

21. An electrical test instrument as set forth in claim 17, wherein said second communication mode is a radio frequency communication mode.

22. An electrical test instrument as set forth in claim 17, wherein said base unit has a receiving portion at which said remote display is slidably mated.

23. An electrical test instrument as set forth in claim 22, further comprising a latching mechanism which releasably retains said remote display unit in mated relationship with said base unit.

24. A multimeter comprising:
a base unit having a plurality of test lead jacks and a rotary selector knob;
a remote display unit separate from but matable with said base unit, said remote display unit having a display operative to show measured parameters;
communication circuitry operative to provide electrical communication between said base unit and said remote display unit;
said communication circuitry operative to provide electrical communication in a first communication mode when said remote display unit is mated with said base unit and a second communication mode when said remote display unit is located apart from said base unit; and wherein said first and second communication modes are wireless communication modes.

25. A multimeter as set forth in claim 24, wherein said first communication mode is an optical communication mode.

26. A multimeter as set forth in claim 25, wherein said optical communication mode is an infrared (IR) communication mode.

27. A multimeter as set forth in claim 24, wherein said second communication mode is a radio frequency communication mode.

28. A multimeter as set forth in claim 24, wherein said remote display unit has a plurality of display function buttons located thereon.

\* \* \* \* \*

UNITED STATES PATENT AND TRADEMARK OFFICE
CERTIFICATE OF CORRECTION

PATENT NO.       : 8,358,121 B2
APPLICATION NO.  : 12/356885
DATED            : January 22, 2013
INVENTOR(S)      : Jeffrey C. Hudson and Nathaniel J. Wetzel Page 1 of 1

It is certified that error appears in the above-identified patent and that said Letters Patent is hereby corrected as shown below:

On title page 2, item [56]: under OTHER PUBLICATIONS, please delete "Nov. 11" and replace with --Nov. 28--.

In the claims, column 8, line 41, please delete claim reference number "9" and replace with --19--.

Signed and Sealed this
Twenty-sixth Day of November, 2013

Margaret A. Focarino
*Commissioner for Patents of the United States Patent and Trademark Office*